(12) United States Patent
Kim et al.

(10) Patent No.: US 7,935,641 B2
(45) Date of Patent: May 3, 2011

(54) THIN FILM ETCHING METHOD

(75) Inventors: Yeon-hee Kim, Seoul (KR); Jung-hyun Lee, Yongin-si (KR); Yong-young Park, Daejeon-si (KR); Chang-soo Lee, Suwon-si (KR)

(73) Assignee: Samsung Electronic Co., Ltd., Gyeonggi-do (KR)

( * ) Notice: Subject to any disclaimer, the term of this patent is extended or adjusted under 35 U.S.C. 154(b) by 319 days.

(21) Appl. No.: 11/984,760

(22) Filed: Nov. 21, 2007

(65) Prior Publication Data

US 2008/0166834 A1    Jul. 10, 2008

(30) Foreign Application Priority Data

Jan. 5, 2007   (KR) .................. 10-2007-0001578

(51) Int. Cl.
*H01L 21/302* (2006.01)
*H01L 21/461* (2006.01)

(52) U.S. Cl. ............ 438/742; 438/718; 216/75; 216/76; 257/E21.033; 257/E21.222; 257/E21.486

(58) Field of Classification Search .................. 438/718, 438/742, 722; 216/76, 74, 75; 257/E21.033, 257/E21.222, E21.486
See application file for complete search history.

(56) References Cited

U.S. PATENT DOCUMENTS

| | | | |
|---|---|---|---|
| 5,094,978 A * | 3/1992 | Miyagaki et al. ............. | 438/609 |
| 5,888,410 A * | 3/1999 | Ishihara et al. .................... | 216/5 |
| 2001/0008227 A1* | 7/2001 | Sadamoto et al. ............. | 216/23 |
| 2002/0020875 A1* | 2/2002 | Arao et al. ..................... | 257/347 |
| 2007/0063211 A1* | 3/2007 | Iwasaki ........................... | 257/98 |
| 2008/0038929 A1* | 2/2008 | Chang .......................... | 438/722 |
| 2009/0239335 A1* | 9/2009 | Akimoto et al. ............. | 438/104 |

* cited by examiner

*Primary Examiner* — Caridad M Everhart
(74) *Attorney, Agent, or Firm* — Harness, Dickey & Pierce P.L.C.

(57) ABSTRACT

Example methods may provide a thin film etching method. Example thin film etching methods may include forming a Ga—In—Zn—O film on a substrate, forming a mask layer covering a portion of the Ga—In—Zn—O film, and etching the Ga—In—Zn—O film using the mask layer as an etch barrier, wherein an etching gas used in the etching includes chlorine. The etching gas may further include an alkane ($C_nH_{2n+2}$) and $H_2$ gas. The chlorine gas may be, for example, $Cl_2$, $BCl_3$, and/or $CCl_3$, and the alkane gas may be, for example, $CH_4$.

19 Claims, 3 Drawing Sheets

THIN FILM ETCHING METHOD

PRIORITY STATEMENT

This application claims benefit under §119 to Korean Patent Application No. 10-2007-001578, filed on Jan. 5, 2007, in the Korean Intellectual Property Office, the entire disclosure of which is incorporated herein by reference.

BACKGROUND

1. Field

Example embodiments may relate to a thin film etching method, for example, to an etching method of a Ga—In—Zn—O film.

2. Description of the Related Art

Thin film transistors may be used as switching devices in flat panel display devices such as liquid crystal display devices an d organic light-emitting display devices. Mobility, leakage current, and other performance factors of thin film transistors may be dependent on the quality and/or status of an active layer of the thin film transistors, wherein the active layer may be a path in which carriers may move.

In related art liquid crystal display devices, many active layers of the thin film transistors may be amorphous silicon films. If an active layer of a thin film transistor is an amorphous silicon film, electrical charge mobility may be lower—around 0.5 cm$^2$/Vs—and operating speeds of a liquid crystal display device may not increase due to the amorphous silicon film.

Material films may have increased electrical charge mobility than amorphous silicon films if used as active layers of thin film transistors. To use a material film as an active layer, the material film may need to be easily processed.

SUMMARY

Example embodiments may provide an etching method of a thin film formed of a material having higher electrical charge mobility than an amorphous silicon.

Example methods may include forming a Ga—In—Zn—O film on a substrate; forming a mask layer covering a portion of the Ga—In—Zn—O film, and/or etching the Ga—In—Zn—O film using the mask layer as an etch barrier. An etching gas used in the etching may include chlorine.

The Ga—In—Zn—O film may be formed by a sputtering method or the like. A target material used in the sputtering method may include, for example, $In_2O_3$, $Ga_2O_3$, ZnO, and/or another suitable material.

The Ga—In—Zn—O film may be a $Ga_{x+y}In_{x+z}Zn_xO$ film, where y may be approximately between 1.0 and 1.7, and x may be approximately between 1.0 and 1.5.

The etching gas may include a first component selected from the group including $Cl_2$, $BCl_3$, and $CCl_3$.

The etching gas may also include a second component including an alkane ($C_nH_{2n+2}$), such as $CH_4$ and $H_2$ gas.

The etching gas may further include an inert gas.

The content of the first component of the etching gas may be about 46% to about 63%.

The content of the second component of the etching gas may be about 30% to about 42%.

Etching may be performed by an RIE method, an ME-RIE method, an ICP-RIE method, and/or an ECR method.

About 400 W to about 700 W of RF power may be applied to the substrate during etching. Alternatively, etching may be performed by a plasma etching method without applying RF power to the substrate.

The mask layer may be a photo sensitive layer that may be hardened by exposure to UV rays, a silicon oxide layer, and/or a silicon nitride layer.

BRIEF DESCRIPTION OF THE DRAWINGS

The above and other features and/or advantages of example embodiments may become more apparent by describing them in detail with reference to the attached drawings in which.

DETAILED DESCRIPTION

Figure 1A:
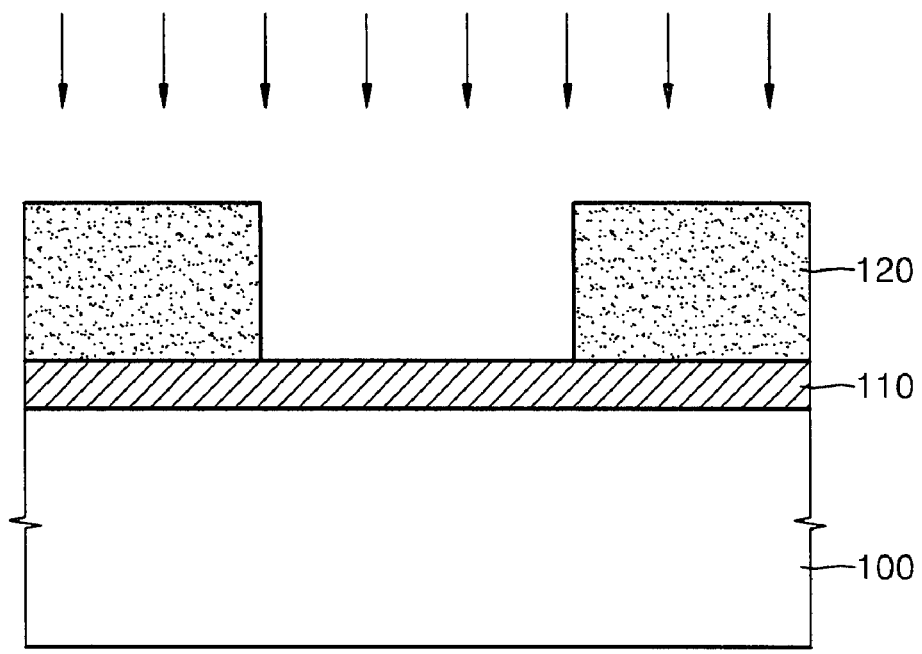
FIGS. 1A through 1C are cross-sectional views illustrating an example method of etching a Ga—In—Zn—O film.

Example embodiments will now be described more fully with reference to the accompanying drawings. Embodiments, however, may be embodied in many different forms and should not be construed as being limited to example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 1B:
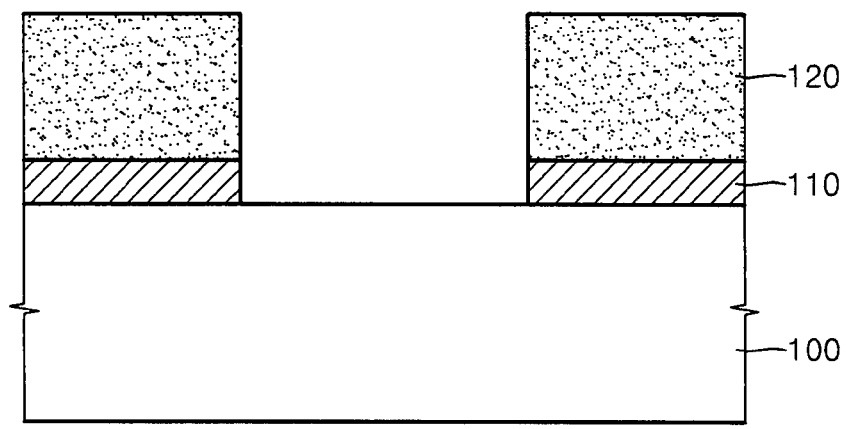
Figure 1C:
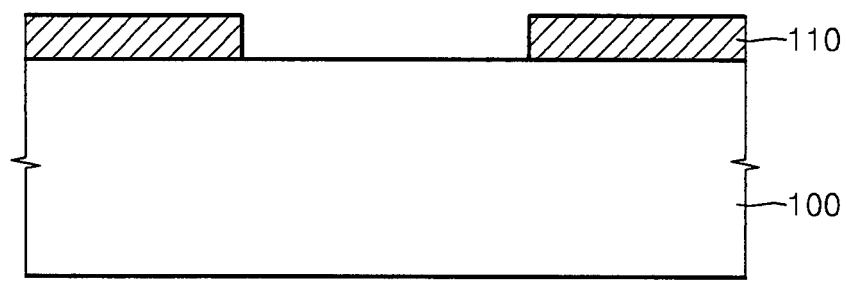

Applicants have discovered that a Ga—In—Zn—O film may be used as an example of a material film. Applicants have discovered that a processing method such as etching of Ga—In—Zn—O film may be difficult to conduct. FIGS. 1A through 1C illustrate an example method of etching a Ga—In—Zn—O film 110 that may solve this problem.

As shown in FIG. 1A, a Ga—In—Zn—O film 110 may be on a substrate 100. The Ga—In—Zn—O film 110 may be a compound film formed using any known method, such as a sputtering method, for example. The target materials in the Ga—In—Zn—O film 110 may include $In_2O_3$, $Ga_2O_3$, ZnO, and/or another suitable material. The Ga—In—Zn—O film 110 may be a $Ga_{x+y}In_{x+z}Zn_xO$ film, where y is approximately between 1.0 and 1.7 and z is approximately between 1.0 and 1.5.

After the Ga—In—Zn—O film 110 is formed, a mask layer 120 covering portions of the Ga—In—Zn—O film 110 may be formed on the Ga—In—Zn—O film. The mask layer 120 may be a photo sensitive layer, a silicon oxide layer, a silicon nitride layer, and/or another suitable layer type. Forming the mask layer 120 using a photo sensitive layer may include removing a region of the photo sensitive layer by light exposure and development followed by a bake process such as an ultraviolet (UV) bake process that may harden the remaining photo sensitive layer.

The exposed portion of the Ga—In—Zn—O film 110 may be etched using the mask layer 120 as an etch barrier. The etching may be performed until the substrate 100 is exposed. Etching gases may include a first component including chlorine and/or a second component including hydrocarbon compounds. The first component may be, for example, $Cl_2$, $BCl_3$ and/or $CCl_3$. The second component may include, for example, alkane hydrocarbon compounds $C_nH_{2n+2}$. For example, the first component may be $Cl_2$ and the second component may be $CH_4$. The etching gas may further include $H_2$ gas. If the etching gas includes $Cl_2$, $CH_4$, and $H_2$, the volumetric flow rate of $Cl_2$, $CH_4$ and $H_2$ may be about 25.5 sccm to about 34.5 sccm for $Cl_2$, about 17 sccm to about 23 sccm for $CH_4$, and about 4.25 sccm to about 5.75 sccm for $H_2$ such that the partial pressure of the $Cl_2$ may be about 46% to about 63% of the total pressure, and the partial pressure of the $CH_4$ may be about 30% to about 42% of the total pressure. Under these partial pressure conditions, a screen effect of by-products, such as an amorphous hydrogenated carbon (a-C:H), may be prevented or reduced and a satisfactory etching slope may be obtained.

The first component may react with Zn of the Ga—In—Zn—O film 110 during the etching process to generate volatile $ZnCl_x$ and may also react with Ga and In of the Ga—In—Zn—O film 110. The second component may react with Zn of the Ga—In—Zn—O film 110 to generate volatile $Zn(CH_x)_y$. $H_2$ gas may facilitate the reaction between Zn and $CH_3$ that may form from $CH_4$.

Etching of the Ga—In—Zn—O film 110 may be performed by a reactive ion etch (RIE) method, a magnetic enhanced-RIE (ME-RIE) method, an inductively coupled plasma-RIE (ICP-RIE) method, and/or an electron cyclotron resonance (ECR) method. If etching the Ga—In—Zn—O film 110, about 400 W to about 700 W of RF power may be applied to the substrate 100, and the reaction rate between Zn and $CH_3$ may be increased by this RF power, potentially enhancing the etching efficiency.

If etching using ME-RIE equipment, approximately 60 G (Gauss) of induced magnetic field may be generated in the etching chamber, and approximately 550 W of RF power may be applied to the substrate 100 during etching. Pressure in the etching chamber may be approximately 20 mtorr.

As a result of the etching, the exposed portion of the Ga—In—Zn—O film 110 may be removed, and the substrate 100 may be exposed as illustrated in FIG. 1B.

After the etching, the mask layer 120 may be removed. If the mask layer 120 is a photo sensitive layer, the mask layer 120 may be removed by an $O_2$ ashing method, an $O_2$ plasma ashing method, and/or a wet washing method using an organic solvent. FIG. 1C illustrates the Ga—In—Zn—O film 110 and the substrate 100 after the mask layer 120 is removed.

Although not illustrated, if a portion of reaction by-products generated during the etching remains on the mask layer 120 or on the mask layer 120 and the substrate 100, a process for removing the reaction by-products may be performed before or after removing the mask layer 120. The removing of the reaction by-products may be performed by a plasma dry etching method using, for example, $H_2$, Ar, $N_2$, $O_2$, and/or F-series gases.

An experiment of etching the Ga—In—Zn—O film 110 was performed using example etching methods. The etching experiment was performed using the ME-RIE equipment. The strength of an induced magnetic field in the chamber during the etching experiment was approximately 60 G. The pressure in the chamber was approximately 20 mtorr, and the RF power applied to the substrate 100 was about 550 W. $Cl_2$, $CH_4$ and $H_2$ gases were used, and the volumetric flow rate of each gas was about 30 sccm, 20 sccm, and 5 sccm, respectively. Etching of the Ga—In—Zn—O film 110 was performed for 60 seconds.

Figure 2:
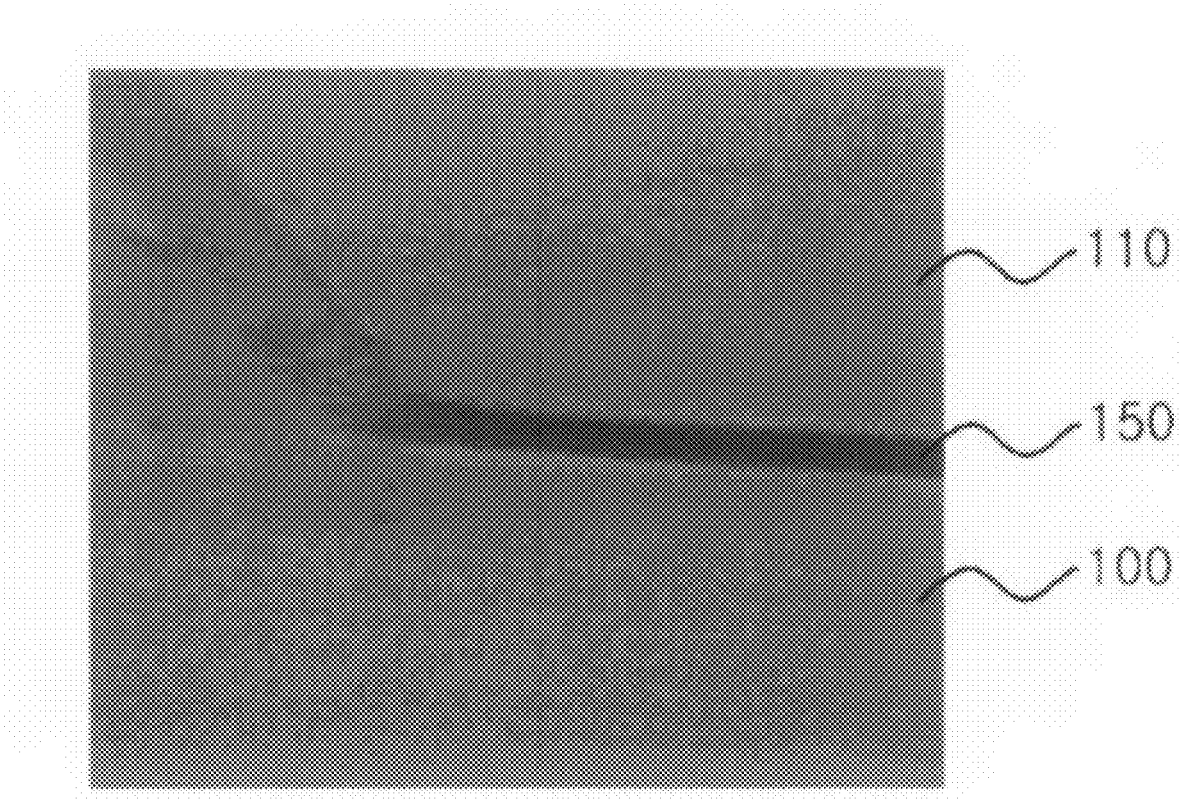
FIG. 2 is a scanning electron microscopic (SEM) image of a Ga—In—Zn—O film etched by an example method of etching a Ga—In—Zn—O film.

FIG. 2 is a scanning electron microscopic (SEM) image of the Ga—In—Zn—O film obtained from the etching experiment.

As shown in FIG. 2, the Ga—In—Zn—O film 110 may be etched with a satisfactory slope even if the etching slope of the Ga—In—Zn—O film 110 may not be perpendicular and/or no reaction by-products remain. The substrate 100 and an etching face 150 respectively are illustrated in FIG. 2.

Because the Ga—In—Zn—O film 110 may have a higher electrical charge mobility than an amorphous silicon film, the operating speed of a liquid crystal display device may be increased by about 50 or more times by using the Ga—In—Zn—O film 110 as an active layer material of a thin film transistor.

While example embodiments have been particularly shown and described with reference to the attached figures, it will be understood by one of ordinary skill in the art that various changes in form and details may be made therein without departing from the spirit and scope of the disclosure as defined by the following claims. For example, the etching of the Ga—In—Zn—O film 110 may be performed by a plasma etching method without applying RF power to the substrate 100, and the etching gas may further include an inert gas such as Ar. Also, the Ga—In—Zn—O film 110 may also be used for other usages such as a gate material of memory devices in addition to as an active layer of thin film transistor.

What is claimed is:

1. A thin film etching method comprising:
   etching a Ga—In—Zn—O film using a mask layer as an etch barrier, the etching using an etching gas including chlorine and alkane ($C_nH_{2n+2}$).

2. The thin film etching method of claim 1, wherein the Ga—In—Zn—O film is a $Ga_{x+y}In_{x+z}Zn_xO$ film, wherein y is about 1.0 to about 1.7 and wherein z is about 1.0 to about 1.5.

3. The thin film etching method of claim 1, wherein the alkane is $CH_4$.

4. The thin film etching method of claim 1, wherein a partial pressure of a component including the alkane is about 30% to about 42% of a total etching gas pressure.

5. The thin film etching method of claim 1, wherein the etching gas further includes an inert gas.

6. The thin film etching method of claim 1, wherein the etching gas further includes $H_2$.

7. The thin film etching method of claim 1, wherein the etching is performed by at least one of an RIE method, an ME-RIE method, an ICP-RIE method, and an ECR method.

8. The thin film etching method of claim 1, wherein the etching includes applying about 400 W to about 700 W of RF power to a substrate on which the Ga—In—Zn—O film is formed.

9. The thin film etching method of claim 1, wherein the etching is performed by a plasma etching method without applying RF power to the substrate.

10. The thin film etching method of claim 1, wherein the mask layer includes at least one of a photo sensitive layer, a silicon oxide layer, and a silicon nitride layer.

11. The thin film etching method of claim 1, wherein the mask layer is a photo sensitive layer hardened by ultraviolet rays.

12. The thin film etching method of claim 1, wherein the Ga—In—Zn—O film is formed on a substrate by a sputtering method.

13. The thin film etching method of claim 12, wherein a target material used in the sputtering method includes at least one of $In_2O_3$, $Ga_2O_3$, and ZnO.

14. The thin film etching method of claim 1, wherein the etching gas includes a first component and a second component, the first component including at least one of $Cl_2$, $BCl_3$, and $CCl_3$.

15. The thin film etching method of claim 14, wherein a partial pressure of the first component is about 46% to 63% of a total etching gas pressure.

16. A thin film etching method comprising:
    etching a Ga—In—Zn—O film using a mask layer as an etch barrier, the etching using an etching gas including chlorine and $H_2$.

17. The thin film etching method of claim 16, wherein the etching gas includes a first component and a second component, the first component including at least one of $Cl_2$, $BCl_3$, and $CCl_3$.

18. The thin film etching method of claim 16, wherein the etching gas includes a first component and a second component, the first component including the chlorine, and the second component including an alkane ($C_nH_{2n+2}$).

19. The thin film etching method of claim 16, wherein the etching gas further includes an inert gas.

* * * * *